United States Patent [19]

Uratani et al.

[11] 4,453,236
[45] Jun. 5, 1984

[54] MEMORY ARRAY ADDRESSING CIRCUITRY

[75] Inventors: Munehiro Uratani, Kashihara; Setsufumi Kamuro, Yamatokoriyama, both of Japan

[73] Assignee: Sharp Kabushiki Kaisha, Osaka, Japan

[21] Appl. No.: 141,616

[22] Filed: Apr. 18, 1980

[30] Foreign Application Priority Data

Apr. 18, 1979 [JP] Japan .............................. 54-52207[U]

[51] Int. Cl.³ ............................................ G11C 13/00
[52] U.S. Cl. .................................... 365/195; 365/230
[58] Field of Search .................... 365/230, 195, 189

[56] References Cited

U.S. PATENT DOCUMENTS

| 3,471,838 | 10/1969 | Ricketts et al. | 365/195 |
| 3,969,706 | 7/1976 | Probsting | 365/230 |
| 4,037,098 | 8/1977 | Horninger | 365/230 |

*Primary Examiner*—Terrell W. Fears
*Attorney, Agent, or Firm*—Birch, Stewart, Kolasch & Birch

[57] ABSTRACT

An integrated circuit comprises a memory array containing a plurality of memory cells arranged in a matrix shape having rows and columns, and memory array addressing circuitry for addressing such array in accordance with addressing signals. Said addressing circuitry comprises a number of gates responsive to addressing signals for addressing the array. Only one of the number of gates has a control signal applied thereto which places the memory array in such a condition that none of the memory cells is selected for addressing purposes, and the remaining gates do not have a control signal applied even under the same situation, wherein none of the memory cells is selected for addressing purposes. The gates comprise an AND gate, an NAND gate, an NOR gate or the like.

4 Claims, 15 Drawing Figures

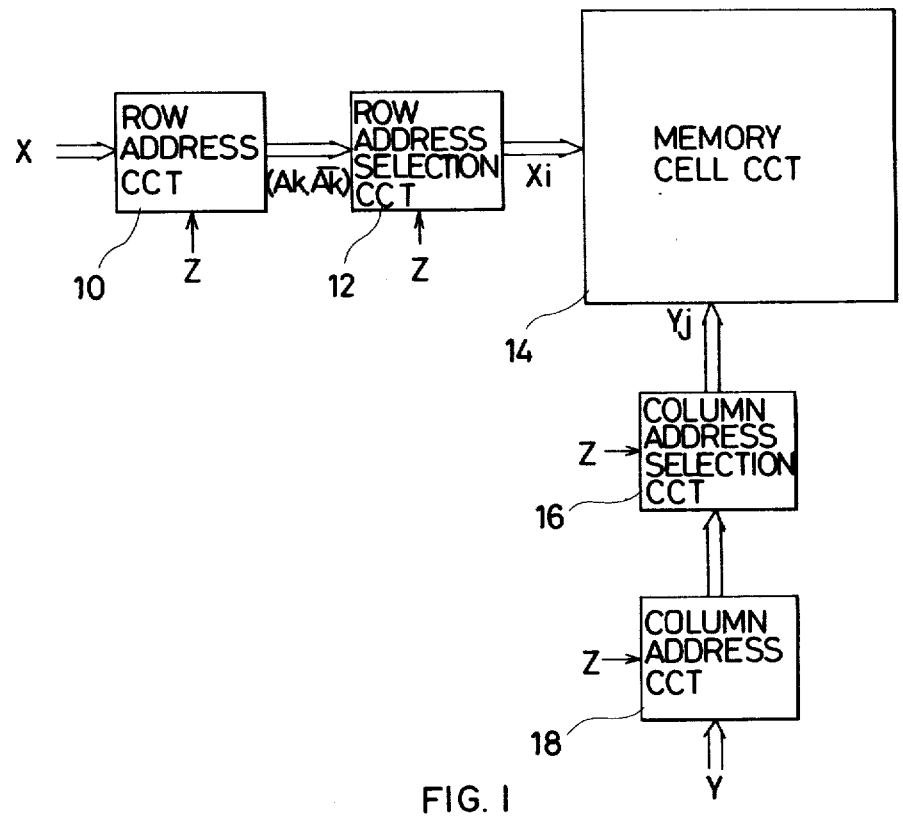
FIG. 1
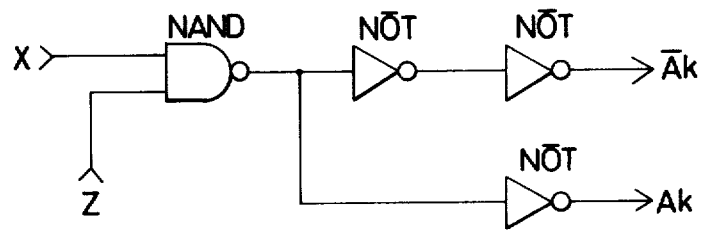
FIG. 2
| Z | H | L |
|---|---|---|
| $\bar{A}k$ | $\bar{X}$ | H |
| $Ak$ | X | L |
FIG. 3

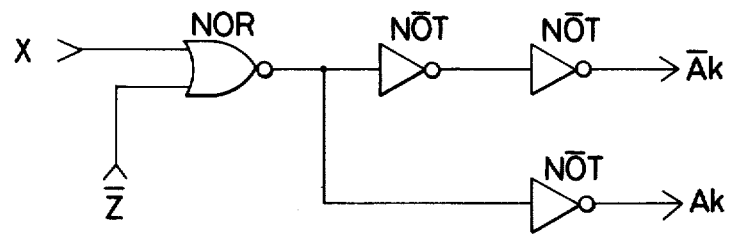
FIG. 4
| Z | H | L |
|---|---|---|
| $\overline{A_k}$ | $\overline{X}$ | L |
| $A_k$ | X | H |
FIG. 5
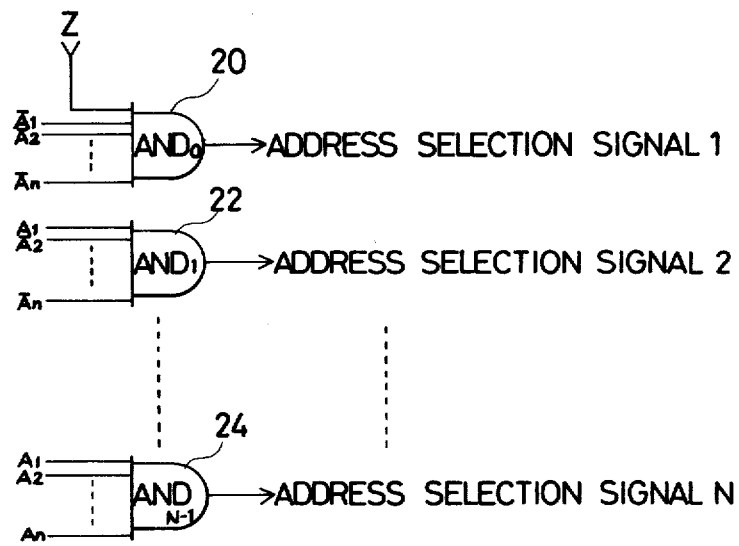
FIG. 6

| type of address selection circuit | the logic of Āk and Ak when Z=L | | the logic of address selection signal to select memory cell circuit | configuration of address selection circuit |
|---|---|---|---|---|
| | Āk | Ak | | |
| 1—a | H | L | H | NAND+NŌT |
| 1—b | H | L | H | NŌR |
| 1—c | H | L | L | NAND |
| 1—d | H | L | L | NŌR+NŌT |
| 2—a | L | H | H | NAND+NŌT |
| 2—b | L | H | H | NŌR |
| 2—c | L | H | L | NAND |
| 2—d | L | H | L | NŌR+NŌT |

FIG. 8 (TYPE 1-a)

FIG. 9 (TYPE 1-b)

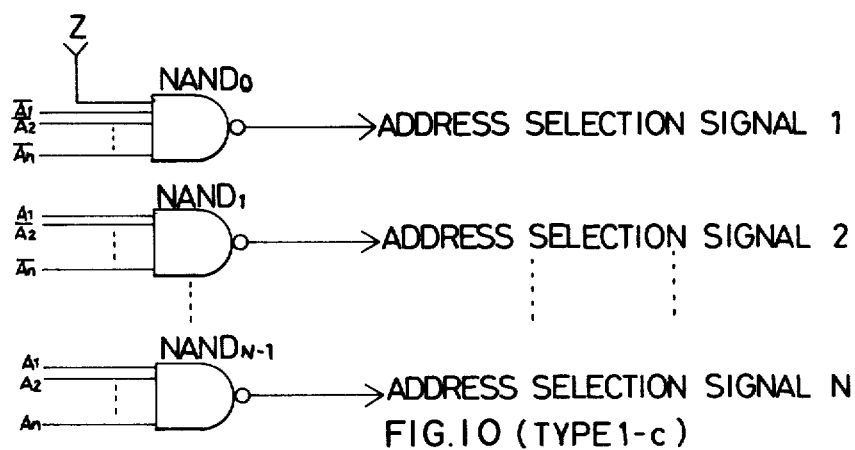
FIG.10 (TYPE1-c)
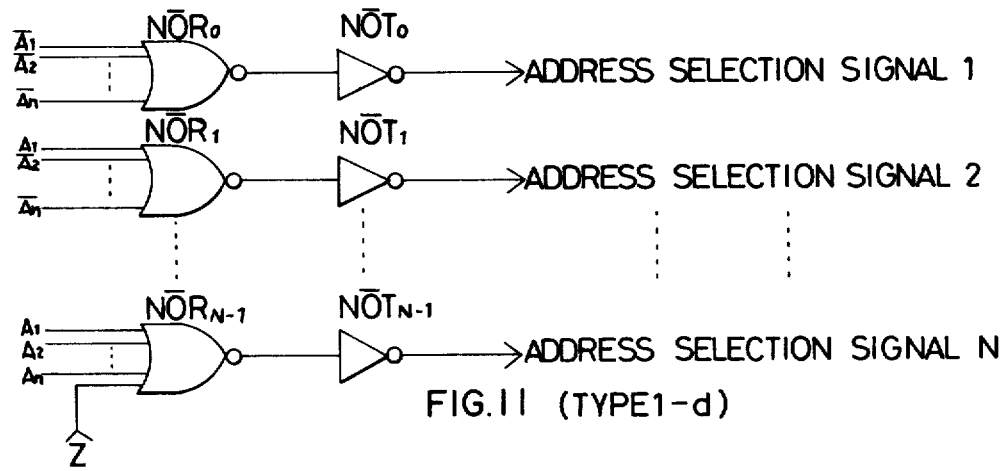
FIG.11 (TYPE1-d)
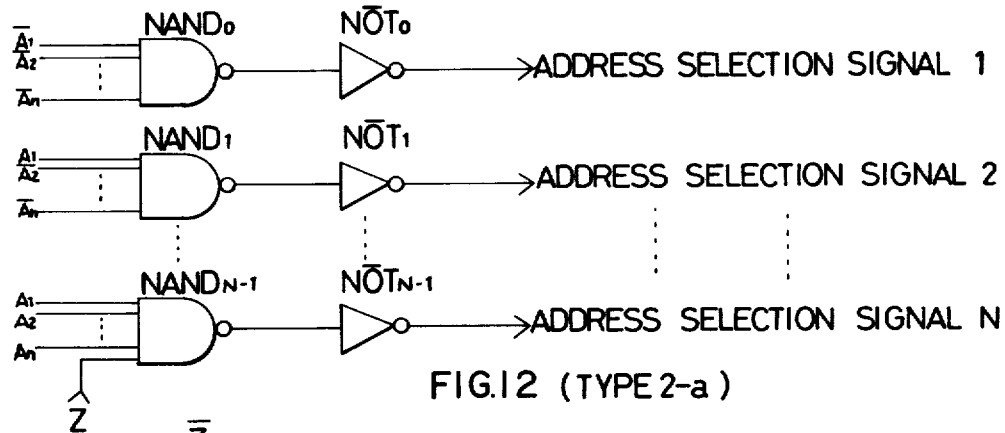
FIG.12 (TYPE2-a)
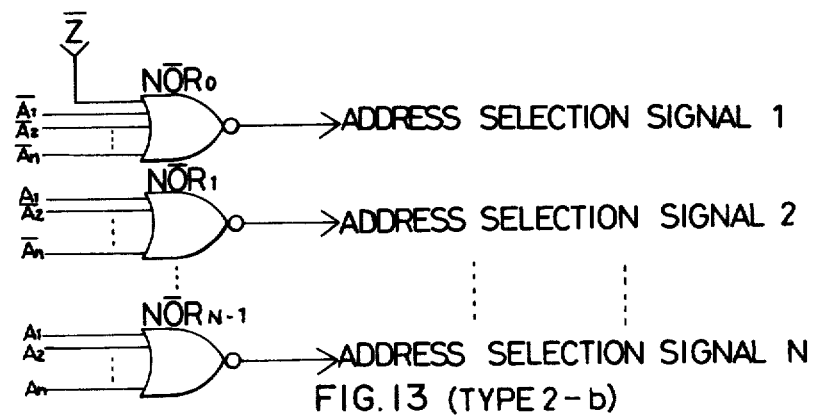
FIG.13 (TYPE2-b)

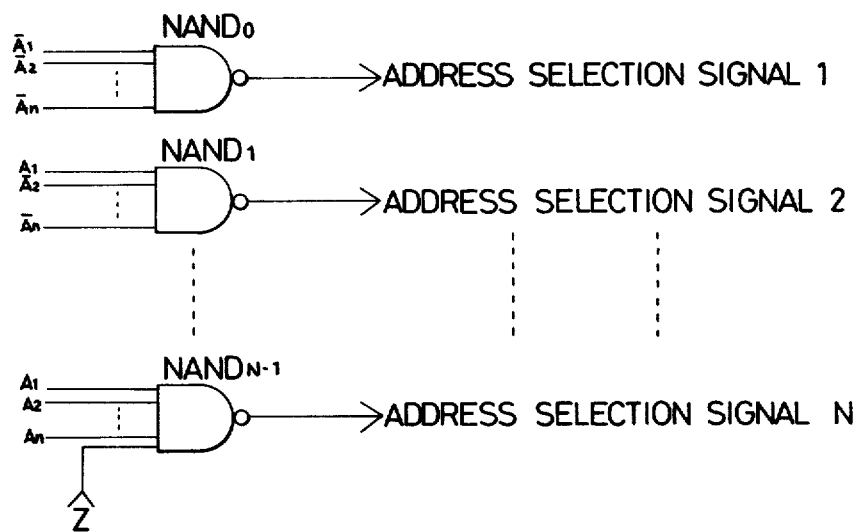
FIG.14 (TYPE2-c)
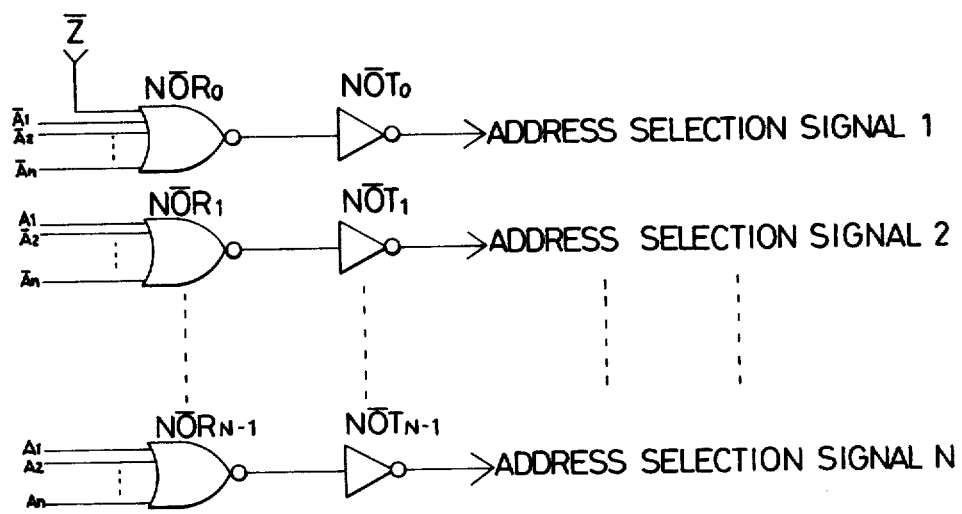
FIG.15 (TYPE2-d)

MEMORY ARRAY ADDRESSING CIRCUITRY

BACKGROUND OF THE INVENTION

The present invention relates to a circuit for a memory cell circuit and, more particularly, to an address selection circuit for a memory cell circuit.

A conventional memory cell circuit comprised a plurality of memory cells aligned in a matrix shape having a number of rows and columns. In response to a selected combination of row and column address selection signals, only one memory cell was selected, for inputting and outputting data signals. An address selection circuit was connected to the memory cell circuit for addressing through the application of addressing signals. Conventionally, the address selection circuit comprised some AND gates having the addressing signals as inputs.

Chip selection enabling signals were provided for placing the memory cell circuit in a chip selection condition wherein one of the memory cells was selected for addressing purposes by a row addressing signal and a column addressing signal. The chip selection enabling signals were applied to all of the AND gates, thereby making the address selection circuit complicated due to the necessity of an additional circuit configuration therefor.

Therefore, it was desired that the address selection circuit be simplified as much as possible.

SUMMARY OF THE INVENTION

Accordingly, it is an object of the present invention to provide an improved address selection circuit.

It is another object of the present invention to provide an improved address selection circuit which is simple enough to be implemented within a semiconductor integrated device.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an integrated circuit comprises a memory array containing a plurality of memory cells arranged in a matrix shape having rows and columns, and memory array addressing circuitry for addressing such array in accordance with addressing signals. The addressing circuitry comprises a certain number of gates responsive to the addressing signals for addressing the array. Only one of the certain number of gates has control signals applied thereto which place the memory array in such a condition that none of the memory cells are selected for addressing purposes, and the remaining gates are prevented from having the control signals applied thereto even under the situation where none of the memory cells are selected for addressing purposes. The gates comprise an AND gate, an NAND gate, an NOR gate or the like.

BRIEF DESCRIPTION OF THE DRAWINGS

The present invetion will be come more fully understood from the detailed description given hereinbelow and accompanying drawings which are given by way of illustration only, and thus are not limitative of the present invention and wherein;

FIG. 1 is a block diagram of a memory circuit for use with the present invention;

FIGS. 2 and 4 show a block diagram of an address circuit included within the memory circuit;

FIGS. 3 and 5 are a truth table associated to the address circuit shown in FIGS. 2 and 4, respectively;

FIG. 6 shows a block diagram of an example of an address selection circuit according to the present invention;

FIGS. 8 through 15 show a block diagram of the examples of the address selection circuits summarized in the table of FIG. 7.

DESCRIPTION OF THE INVENTION

Figure 7:
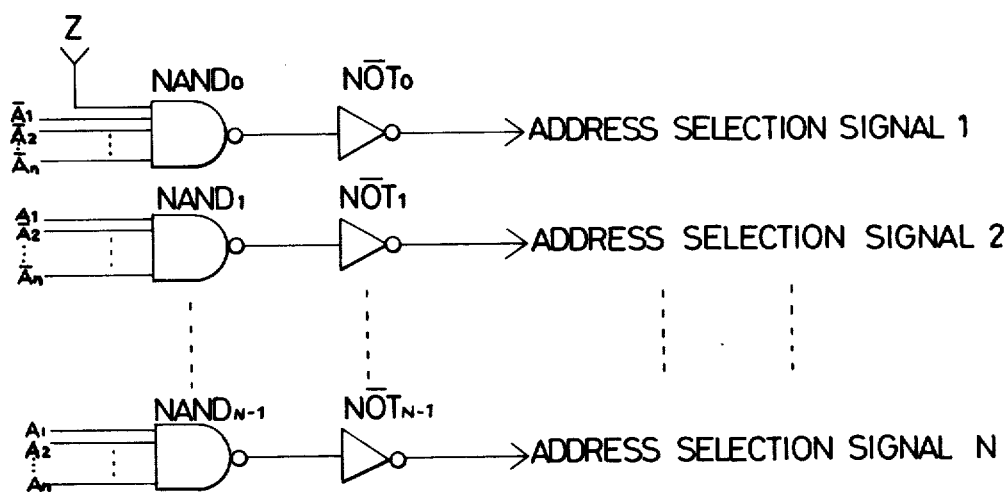
FIG. 7 shows a table summarizing some examples of the address selection circuits.
Figure 7:
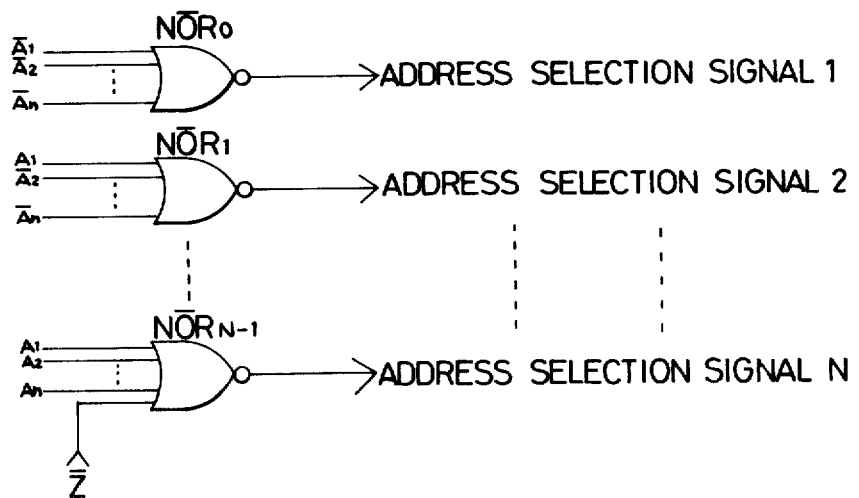

FIG. 1 shows a block diagram of a memory circuit for use with the present invention. The memory circuit comprises a row address circuit 10, a row address selection circuit 12, a memory array or a memory cell circuit 14, a column address selection circuit 16, and a column address circuit 18.

The memory cell circuit 14 comprises a plurality of memory cells aligned in a matrix shape having a number of rows and columns. For the purpose of selecting a selected memory cell having an address (i, j) in the memory cell circuit 14, row address signals X and column address signals Y are repsectively applied to the row address circuit 10 and the column address circuit 18. The memory cell specififed by these address signals is selected for inputting or outputting data signals for data loading and data developing purposes.

In response to the entry of these kinds of address signals, the row address circuit 10 and the column address circuit 18 generate address enabling signals Ak and $\overline{Ak}$, (k=1 ... n). They are admitted to the row address selection circuit 12 and the column addresds selection circuit 16. They develop row address selection signals Xi and column address selection signals Yj to specify the memory cell having an address (i, j).

Chip selection enabling signals Z enter the row address circuit 10, the row address selection circuit 12, the column address selection circuit 16 and the column address circuit 18. The chip selection enabling signals Z function to place the memory cell circuit 14 in a chip selection condition corresponding to a high level wherein one of the memory cells is selected by the row address signal X and the column address signal Y. As long as the memory cell circuit 14 is placed in the chip selection conditions, one of the memory cells is selected by the row address signal X and the column address signal Y. It is necessary to place all of the memory cells of the memory cell circuit 14 in a non-chip selection condition when none of the memory cells is selected.

FIGS. 2 and 4 are more detailed block diagram of the row address circuit 10 and the column address circuit 18. FIGS. 3 and 5 shows a truth table of each of the block diagrams of FIGS. 2 and 4.

The row address signals X and chip selection enabling signals Z are entered to allow the address enabling signals Ak and $\overline{Ak}$ (k=1, 2, ... n) as far as the row address circuit 10 is concerned. As for the column address circuit 18, the row address signals X are replaced by the column address signals Y.

In FIGS. 3 and 5, the reference character "H" is referred to a high level and the reference character "L" referred to a low level. The reference characters "X" and "X" refer to unchanged levels of the signals Ak and $\overline{Ak}$.

Among the 2n kinds of the address enabling signals Ak and $\overline{Ak}$ (k=1, 2 . . .n), n kinds of them are selected and entered to the row address selection circuit 12 and the column address selection circuit 16 to provide the row address selection signals Xi and the column address selection signals Yj.

FIG. 6 shows a more detailed block diagram of the row address selection circuit 12 and the column address selection circuit 16 in connection with the row address circuit 10 and the column address circuit 18 shown in FIG. 2.

In FIG. 6, a necessary number of AND gates 20, 22, and 24 are provided for generating address selection signals 1, 2, . . . N. They receive the address enabling signals Ak or $\overline{Ak}$ (k=1, 2 . . . n). The chip selection enabling signals Z are applied to only the AND gate 20 having reversed address enabling signals $\overline{A}/\overline{K}$(k=1, 2 . . . n) as input signals.

On the contrary, the chip selection enabling signals Z are not applied to any of the remaining AND gates 22 and 24 which have at least one kind of unreversed address enabling signals Ak (k=1, 2, . . . n) as input signals.

As shown in FIG. 3, the logic of the reversed address enabling signals $\overline{A}_1, \overline{A}_2, \ldots \overline{A}_n$ is brought to a high level under the condition that the chip selection enabling signls Z are in a low level and the memory cell circuit 14 is placed in the non-chip selection conditions. Since the AND gate 20 has the reversed address enabling signals $\overline{A}_1, \overline{A}_2, \overline{A}_n$ and the chip selection enabling signals Z of a low level as input signals, it generates address selection signals 1 having a low level. Since all of the AND gates 22 and 24 have n kinds of input signals by the address enabling signals at least one of which is in the low level, they develop address selection signals 2 and N of the low level.

In brief, all of the AND gates 20, 22 and 24 generate the address selection signals 1, 2 and N having a low level in which case the memory cell circuit 14 is placed in the non-chip selection conditions. When one of the AND gates 20, 22 and 24 generates its address selection signals of a high level in the chip selection condition, one related memory cell is selected.

It is unnecessary for both of the row address selection circuit 12 and the column address selection circuit to have the ability to prohibit the chip selection condition of the memory cell circuit 14, because of the nature of the matrix shape of the memory cell circuit 14. Prohibiting the chip selection condition by either the row address or the column address suffices to prohibit presentation of the total chip selection condition of the memory cell circuit 14. By prohibiting the chip selection conditions by one of the row address and the column address, the memory cell circuit 14 is placed in the non-chip selection conditions because the chip selection condition by the remaining chips is automatically prevented.

FIG. 7 shows a table summarizing operation by all the address selection circuits described in the following drawings. In FIG. 7, types of address selection circuits are related to each of the following drawings. The chip selection enabling signals Z having a low level referred to a "L" in the drawing means that the memory cell circuit 14 is not in the chip selection condition.

The type of address circuit shown in FIG. 2 is utilized for the types of address selection circuit "1-a", "1-b", "1-c", and "1-d". The type of address circuit shown in FIG. 4 is used for the types of address selection circuit "2-a", "2-b", "2-c", and "2-d".

FIGS. 8 through 15 represent various types of address selection circuits adapted for the row address selection circuit 12 or the column address selection circuit 16. Throughout the address selection circuits depicted in FIGS. 8 through 15, in accordance with the present invention, the chip selection enabling signals Z are introduced to only one gate. Such a gate provides one kind of address selection signal which is able to select a certain memory cell from the memory cell circuit 14 under the condition where all of the memory cells should be prevented from being selected if the chip selection enabling signals Z having a low level has not applied to the gate.

In accordance with the present invention, the memory array addressing circuitry is simplified enough to be implemented with a semiconductor integrated device.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A system for addressing an M row by N column matrix memory array comprising:
   row address selection means for selecting one of said M rows in said matrix memory array corresponding to a point in memory to be addressed;
   column address selection means for selecting one of said N columns in said matrix memory array corresponding to the point in memory to be addressed;
   said row and column address selection means selecting a point in memory to be addressed in response to application of row and column address signals, the row and column address signals for selecting one of the points in memory being equivalent to the absence of any address signals; and
   control signal application means connected to less than the entirety of said M rows or N columns for inhibiting the application of one of said row or column address signals to said one point in memory when selection of a memory address is undesired to prevent an undesired selection of said one point in memory by the absence of address signals.

2. The system of claim 1 wherein said row selection means includes a plurality of gates corresponding in number to the M rows of said memory array;
   said column selection means including a plurality of gates corresponding in number to the N columns of said memory array.

3. The system of claim 2 wherein said control signal application means applies a selective inhibit signal to an input of the gate corresponding to the row or column of said one point in memory.

4. The system of any of claims 1-3 wherein only one of said row or column address signals is inhibited by said control signal application means.

* * * * *